United States Patent
Schemm et al.

(10) Patent No.: US 9,762,219 B1
(45) Date of Patent: Sep. 12, 2017

(54) CIRCUITRY AND METHODS FOR OPERATING A SWITCHED DRIVER

(71) Applicant: Texas Instruments Incorporated, Dallas, TX (US)

(72) Inventors: Nathan Schemm, Rowlett, TX (US); Rajarshi Mukhopadhyay, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/092,506

(22) Filed: Apr. 6, 2016

(51) Int. Cl.
  *H03K 3/00* (2006.01)
  *H03K 5/04* (2006.01)
  *H03K 17/687* (2006.01)

(52) U.S. Cl.
  CPC .......... *H03K 5/04* (2013.01); *H03K 17/6871* (2013.01)

(58) Field of Classification Search
  None
  See application file for complete search history.

(56) References Cited

U.S. PATENT DOCUMENTS

| | | | |
|---|---|---|---|
| 9,276,413 B1* | 3/2016 | Zhang | H02J 50/12 |
| 2012/0062190 A1* | 3/2012 | Haiplik | H02M 3/156 |
| | | | 323/271 |
| 2013/0038307 A1* | 2/2013 | Saito | H02M 3/335 |
| | | | 323/283 |
| 2016/0072397 A1* | 3/2016 | Deboy | H02M 3/33592 |
| | | | 363/21.1 |

* cited by examiner

*Primary Examiner* — Cassandra Cox
(74) *Attorney, Agent, or Firm* — John R. Pessetto; Charles A. Brill; Frank D. Cimino (57) ABSTRACT

A switched driver for a power supply includes a high-side switch and a low-side switch coupled to the high-side switch. An output is coupled between the high-side switch and the low-side switch. A switch controller is coupled to either the high-side switch or the low-side switch and has a switch controller input for receiving a switch control signal and an output for controlling a switch. The switch controller initially reduces the resistance of the switch, increases the resistance of the switch, and then reduces the resistance of the switch in response to a signal received at the input.

21 Claims, 7 Drawing Sheets

CIRCUITRY AND METHODS FOR OPERATING A SWITCHED DRIVER

BACKGROUND

Switched power supplies have switches that turn off and on or change resistance to control an output voltage. Some of the power supplies include a high-side switch and a low-side switch coupled in series between an input voltage and ground. The output is a node coupled between the high-side switch and the low-side switch. The power supplies have inherent inductance, which causes ringing on the output voltage when the switches change state.

The rate at which the switches change state is sometimes referred to as dv/dt or the slew rate and can affect other components in the power supply or components coupled to the power supply. If the slew rate is too fast, high frequency components of the switch signal can propagate throughout the power supply and interfere with its operation. If the slew rate is too slow, the efficiency of the power supply will decrease. Therefore, the slew rate has to be within certain limitations.

SUMMARY

A switched driver for a power supply includes a high-side switch and a low-side switch coupled to the high-side switch. An output is coupled between the high-side switch and the low-side switch. A switch controller is coupled to either the high-side switch or the low-side switch and has an input for receiving a switch signal and an output for controlling a switch. The switch controller initially reduces the resistance of the switch, then increases the resistance of the switch, and then reduces the resistance of the switch in response to a signal received at the input.

DETAILED DESCRIPTION

Figure 1A:
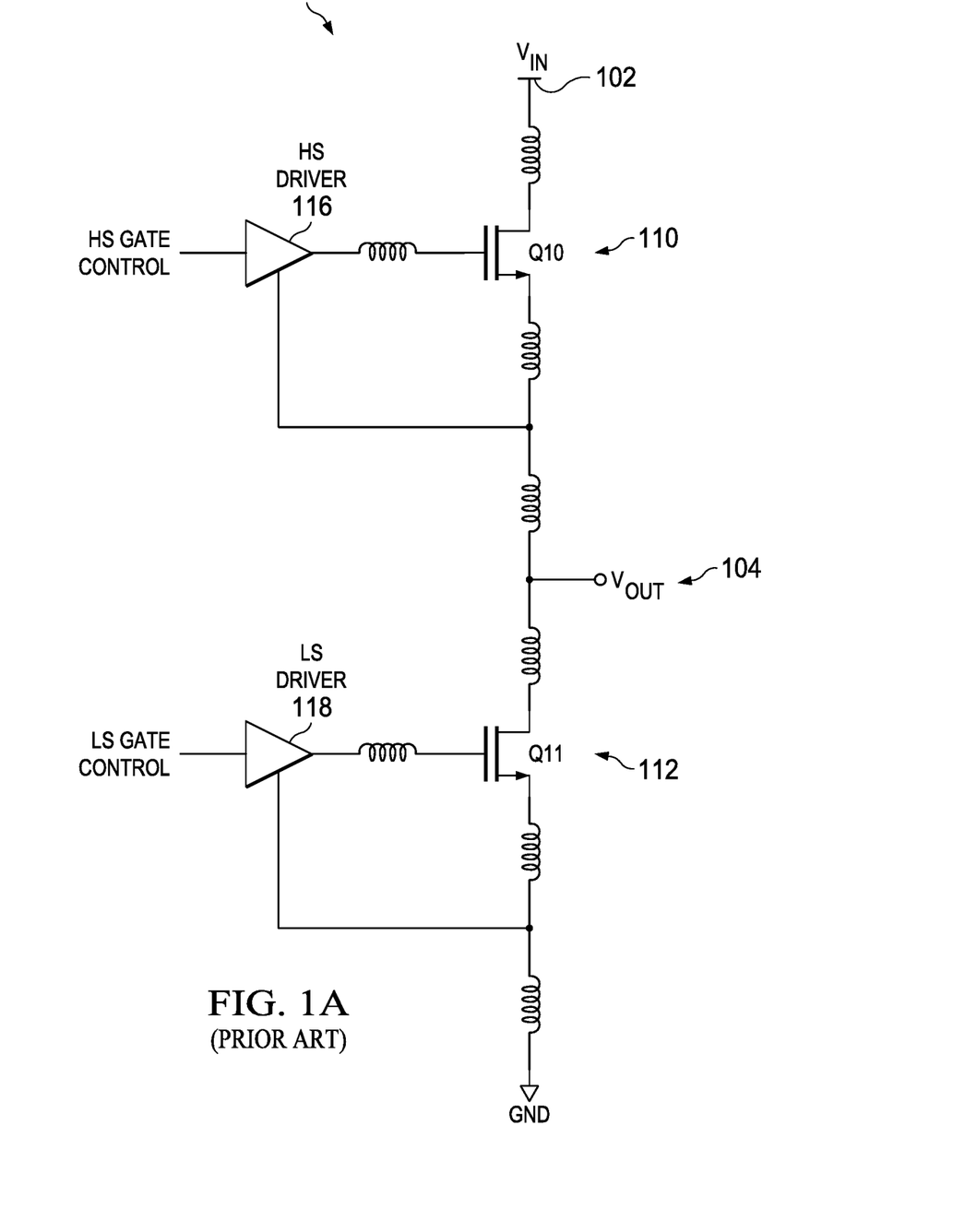
FIG. 1A is a block diagram of a prior art switched driver.
Figure 1B:
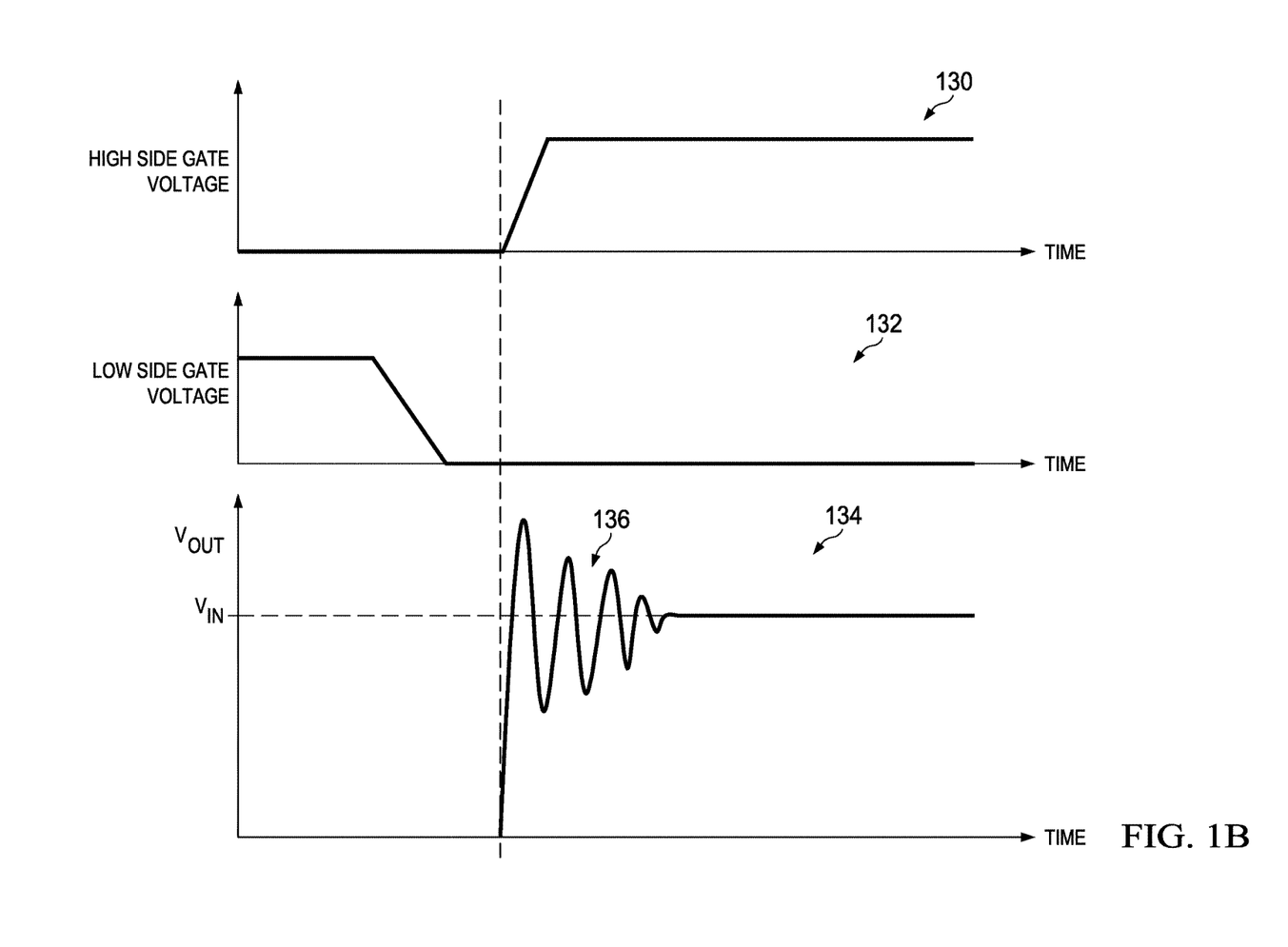
FIG. 1B is a graph showing exemplary ringing on the output voltage at the switch node of the switched driver of FIG. 1.

FIG. 1A is a block diagram of a portion of a prior art switched driver 100. The switched driver 100 is a portion of a power supply, wherein the rest of the power supply is not shown. FIG. 1B is a graph showing exemplary ringing on the output voltage $V_{OUT}$ of the switched driver 100 of FIG. 1A in addition to drive voltages on the switches within the switched driver 100. The switched driver 100 has an input 102 and an output 104. The output 104 is sometimes referred to as the switch node because it is located between a high-side transistor or switch and a low-side transistor or switch as described below. During operation of the power supply 100, an input voltage $V_{IN}$ is present at the input 102 and is converted to an output voltage $V_{OUT}$ that is present at the output 104.

The switched driver 100 is segmented into a high side 110 and a low side 112 wherein the high side 110 is coupled between the input 102 and the output 104 and the low side 112 is coupled between the output 104 and a ground node. The high side 110 includes a high-side switch or transistor Q10, which in the examples provided herein is a field-effect transistor (FET). The gate of transistor Q10 is coupled to a high-side driver 116 that turns transistor Q10 on and off by controlling the gate voltage of transistor Q10. The driver 116 monitors the output voltage $V_{OUT}$ and controls the gate voltage of transistor Q10 in response to the output voltage $V_{OUT}$ and a signal from a high-side controller that is not shown in FIG. 1A. The low side 112 includes a low-side switch or transistor Q11, which in the examples provided herein is a field-effect transistor (FET). The gate of transistor Q11 is coupled to a low-side driver 118 that turns transistor Q11 on and off by controlling the gate voltage of transistor Q11. The driver 118 controls the gate of the transistor Q11 in response to a signal from a low-side controller that is not shown in FIG. 1A. The magnitude of the output voltage $V_{OUT}$ is determined by the periods in which transistors Q10 and Q11 are turned off and on.

The switched driver 100 includes a plurality of inherent inductance, some of which are shown by the inductors of FIG. 1A. In addition, the transistors Q10 and Q11 along with the coupling mechanisms within the switched driver 100 create inherent capacitance. The inductance and capacitance in the switched driver 100 causes substantial ringing in the output voltage $V_{OUT}$ in response to switching of the transistors Q10 and Q11. FIG. 1B includes a graph 130 showing an exemplary high-side gate voltage on the high-side transistor Q10. The increase in the gate voltage shown by the graph 130 results in the high-side transistor Q10 turning on. A graph 132 shows an exemplary low-side gate voltage of the low-side transistor Q11. The decrease in gate voltage results in the low-side transistor Q11 turning off. A graph 134 shows an exemplary output voltage $V_{OUT}$ in response to the high-side transistor Q10 turning on and the low-side transistor Q11 turning off. The switching has resulted in ringing 136 in the output voltage $V_{OUT}$, which causes the above-described problems within the switched driver 100 and to devices being driven by the switched driver 100. The output voltage $V_{OUT}$ eventually settles to the input voltage $V_{IN}$ or to a voltage close to the input voltage $V_{IN}$. The slope of the output voltage $V_{OUT}$ is related to the slew rate or dv/dt. In the examples described herein, the slope of the output voltage $V_{OUT}$ is measured at 140 as it initially rises in response to the high-side transistor Q10 closing.

Figure 2A:
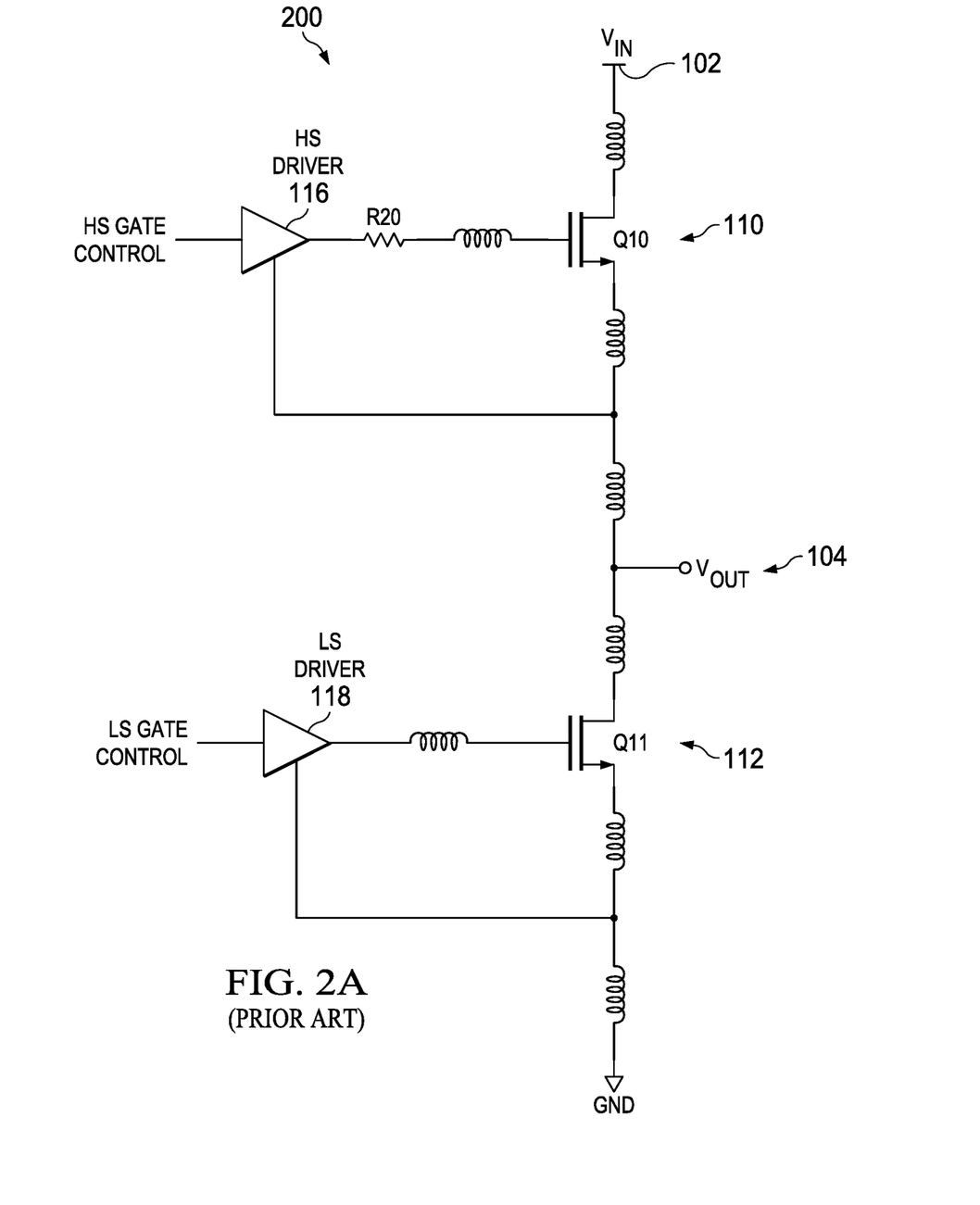
FIG. 2A is a block diagram of a prior art switched driver with a resistance coupled to the gate of the high-side FET.
Figure 2B:
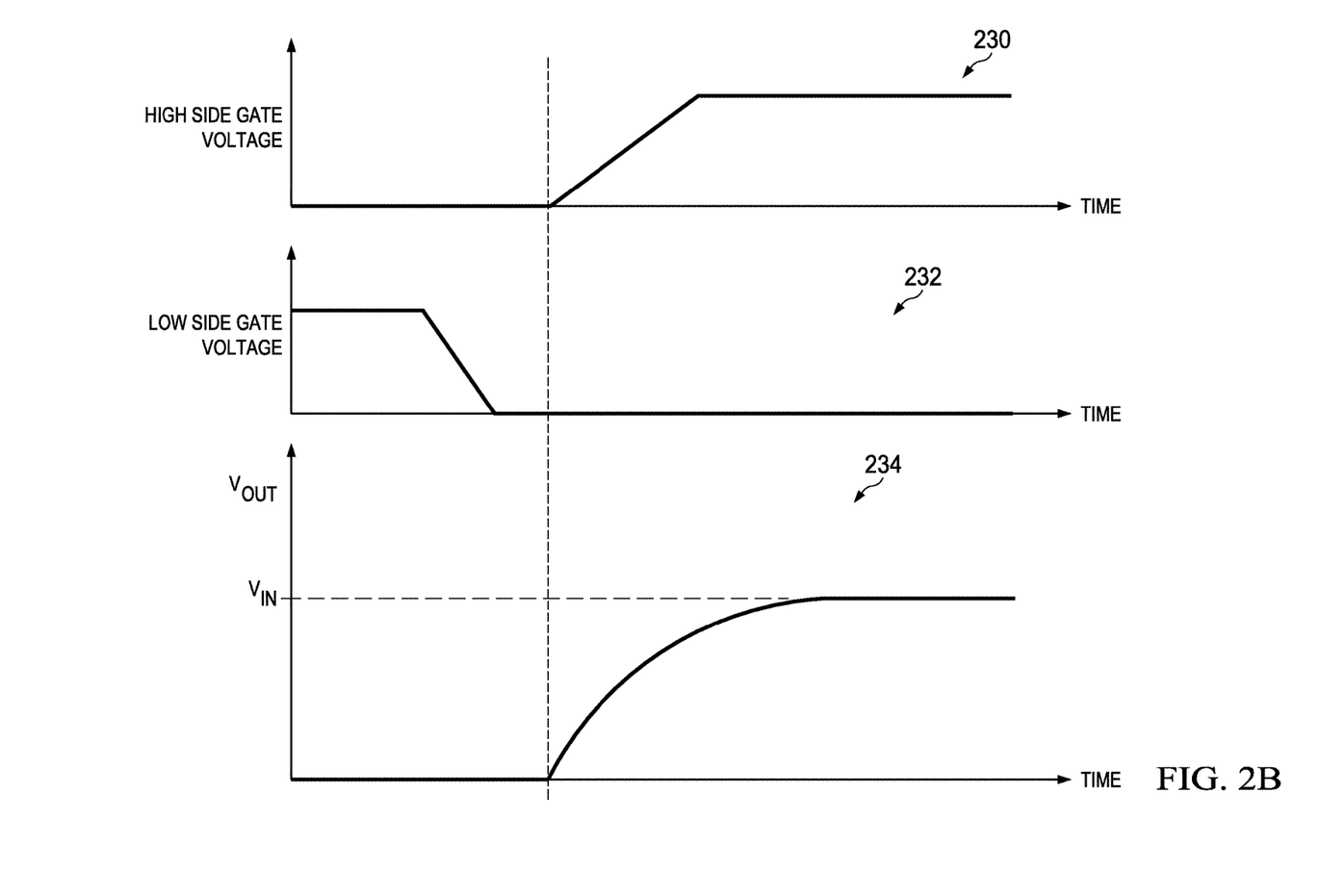
FIG. 2B is a graph showing exemplary voltages of the switched driver of FIG. 2A.

Attempts have been made to attenuate the ringing in the output voltage $V_{OUT}$ of switched drivers such as the switched driver 100. One such attempt is shown in FIG. 2A, which is a block diagram of a prior art switched driver 200 with a resistance R20 coupled to the gate of the high-side transistor Q10. FIG. 2B is graphs showing example high-side and low-side gate voltages on the transistors Q10 and Q11 of FIG. 2A and the resulting output voltage $V_{OUT}$ at the output 104 of the switched driver 200 of FIG. 2A. The switched driver 200 includes a resistance R20 coupled between the output of the high-side driver 116 and the gate of the high-side transistor Q10, which forms a low-pass filter. A graph 230 in FIG. 2B shows the high-side gate voltage on transistor Q10 with the addition of the resistance R20. As shown, the rise time of the gate voltage is much longer than without the resistance R20, which extends the time required for transistor Q10 to fully turn on. A graph 232 shows the low-side gate voltage, which is not affected by the addition of the resistance R20. A graph 234 shows the ringing of the output voltage $V_{OUT}$ with the addition of the resistance R20. As shown by the graph 234, the resistance R20 reduces the ringing on the output voltage $V_{OUT}$, but the response time of the output voltage $V_{OUT}$ is very long. The long delay in the output voltage $V_{OUT}$ reaching its steady state voltage, which is approximately the input voltage $V_{IN}$, adversely affects some devices coupled to the switched driver 200.

Figure 3A:
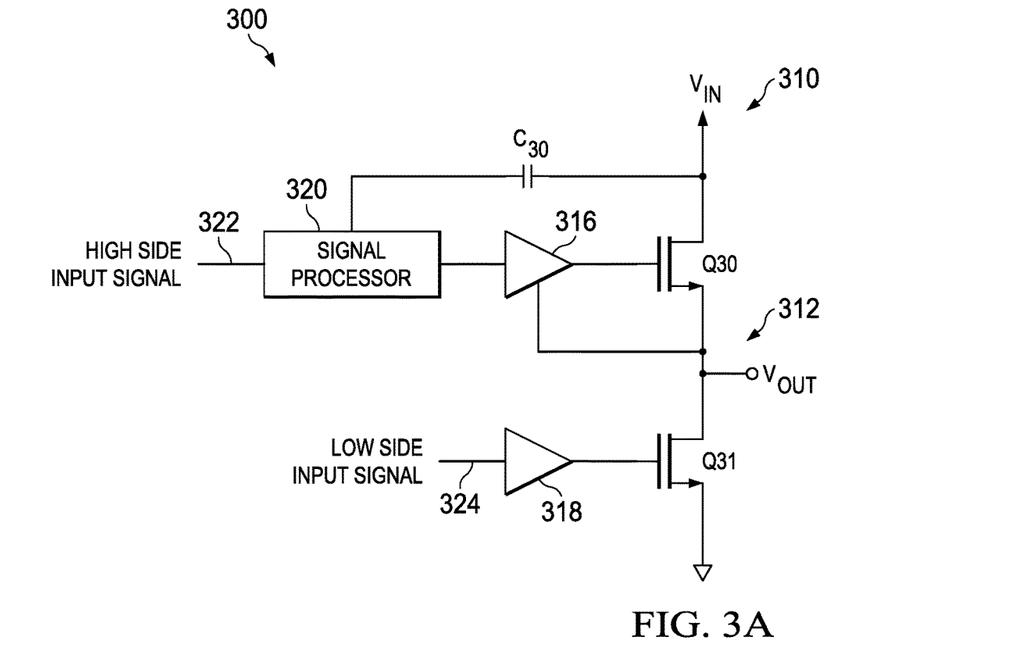
FIG. 3A is a block diagram of an example switched driver circuit for reducing ringing in the output.

The switched drivers and methods of operating switched drivers disclosed herein overcome the problems with previous switched drivers by changing the resistance of at least one of the high-side or low-side switches during a period that ringing would otherwise occur. FIG. 3A is a block diagram of an example switched driver 300 that reduces ringing in the output voltage $V_{OUT}$ relative to conventional switched drivers. The switched driver 300 also enables control of the slew rate or dv/dt of the output voltage $V_{OUT}$ and/or the gate voltage of a switch. The switched driver 300 has an input 310 wherein an input voltage $V_{IN}$ is present at the input 310 when the switched driver 300 is in operation. The input 310 is coupled to a high-side switch, which in the example of FIG. 3A is a FET Q30. The source of transistor Q30 is coupled to an output 312 and the drain of a low-side switch, which in the example of FIG. 3A is a FET Q31. The output voltage $V_{OUT}$ is present at the output 312 when the switched driver 300 is in operation. The source of transistor Q31 is coupled to ground or a node operating at a different potential than the input 310. The gate of transistor Q30 is coupled to a driver 316 and the gate of transistor Q31 is coupled to a driver 318. A signal processor 320 analyzes the drain voltage of transistor Q30 and controls the gate voltage in response to the drain voltage and a high-side signal input 322. In some examples, the processor 320 analyses the voltage between the source and drain of transistor Q30 and controls the gate voltage in response to this voltage. The drain voltage is coupled to the signal processor by way of a capacitor C30. In many examples, the drain voltage and the input voltage $V_{IN}$ are the same or substantially the same. In some examples, the drain voltage referenced herein is the drain to source voltage of the transistor Q30. The driver 316 drives the gate of transistor Q31 in response to a low-side signal input 324. As the gates of transistors Q30 and Q31 are driven harder, their drain/source resistance decreases. In some examples, a signal processor substantially the same as the signal processor 320 controls the driver 318.

Figure 3B:
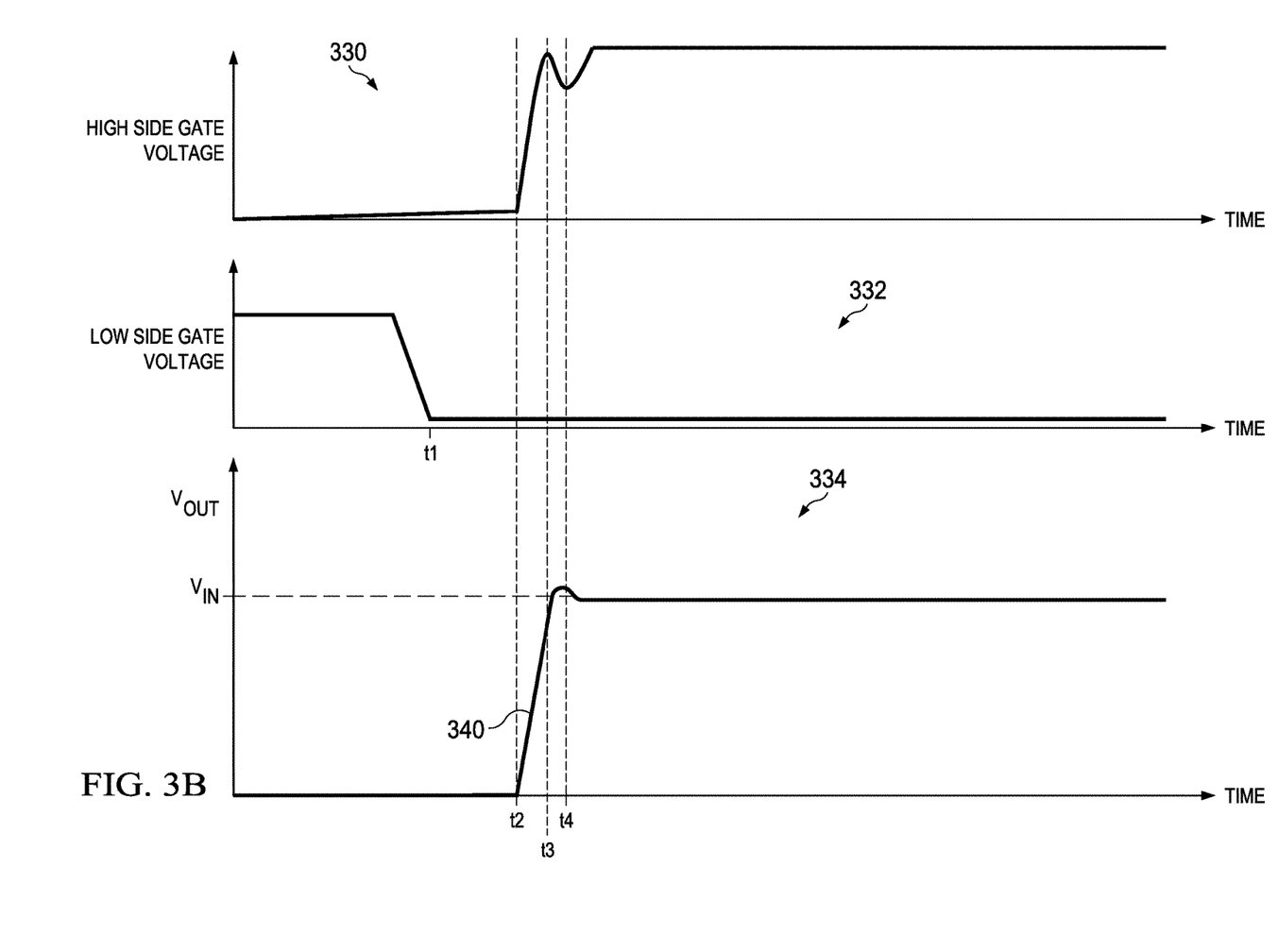
FIG. 3B is a graph showing an example of switching timing to attenuate ringing on the output of the switched driver circuit of FIG. 3A.

FIG. 3B is graphs showing examples of the high-side gate voltage, the low-side gate voltage, and the resulting output voltage $V_{OUT}$ of the switched driver 300. A graph 330 is an example of the high-side gate voltage, which is the gate voltage of the transistor Q30. A graph 332 is an example of the low-side gate voltage, which is the gate voltage of the transistor Q31. A graph 334 is an example output voltage $V_{OUT}$ in response to the high-side gate voltage and the low-side gate voltage. The processor 320 operates to generate the output voltage $V_{OUT}$ shown by the graph 334 by changing the high-side gate voltage per the graph 330 and the low-side gate voltage per the graph 332 as described herein. The processor 320 or circuitry (not shown) coupled to the low-side input 324 turns the low-side transistor Q31 off at time t1 by reducing the gate voltage on transistor Q31 as shown by the graph 332. The processor 320 achieves the rise in the output voltage $V_{OUT}$ shown at time t2 by turning on transistor Q30 until the output voltage $V_{OUT}$ is equal to or substantially equal to the input voltage $V_{IN}$. Turning the transistor Q30 on is shown by the graph 330 when the high-side gate voltage is increased starting at the time t2. Turning a transistor on is sometimes referred to as reducing the drain/source resistance and turning a transistor off is sometimes referred to as increasing the drain/source resistance.

When the output voltage $V_{OUT}$ is equal to or substantially equal to the drain voltage of transistor Q30, the resistance of transistor Q30 is increased by reducing the gate to source voltage of transistor Q30. This event is shown at time t3 in FIG. 3B. As shown in this exemplary embodiment, the high-side gate voltage is reduced prior to the output voltage $V_{OUT}$ reaching the input voltage $V_{IN}$ so as to reduce overshoot of the output voltage $V_{OUT}$. Increasing the resistance of transistor Q30 increases the dampening of the resonance of the output voltage $V_{OUT}$, which reduces the ringing in the output voltage $V_{OUT}$. In some embodiments, the increase in the gate voltage is referred to as instantaneously increasing the resistance of the high-side transistor Q30. After a period, the output voltage $V_{OUT}$ settles at which time the resistance of transistor Q30 is reduced so that the output voltage $V_{OUT}$ will be equal to or substantially equal to the input voltage $V_{IN}$. In the example of FIG. 3B, the resistance is decreased at time t4 and is sometimes referred to as the drain/source voltage equaling zero. The resistance of transistor Q30 at this time is sometimes referred to as the on resistance of the transistor and is achieved by driving the gate of transistor Q4 strong. With reference to FIG. 3A, the high-side gate is typically driven strong at time t4 by a high current.

As described above, driving the gates of either or both the high-side switch or the low-side switch can regulate the slew rate or dv/dt of the output voltage $V_{OUT}$. The slew rate is determined by measuring or calculating the slope of the output voltage $V_{OUT}$. In the example of FIG. 3B, the slope is determined at a portion 340 of the waveform of the output voltage $V_{OUT}$, which is its initial rise. If the slew rate is too fast, the output voltage $V_{OUT}$ will have strong high frequency components which can propagate through capacitive coupling (not shown) in the switched driver 300 and to devices coupled to the switched driver 300. In addition, the high frequency components may generate electromagnetic interference (EMI), which may adversely affect the switched driver 300 and devices located proximate or coupled to the switched driver 300. Embodiments of the switched driver 300 monitor the slew rate and drive the transistors Q30 and Q31 so that the slew rate is within predetermined limitations.

Figure 4:
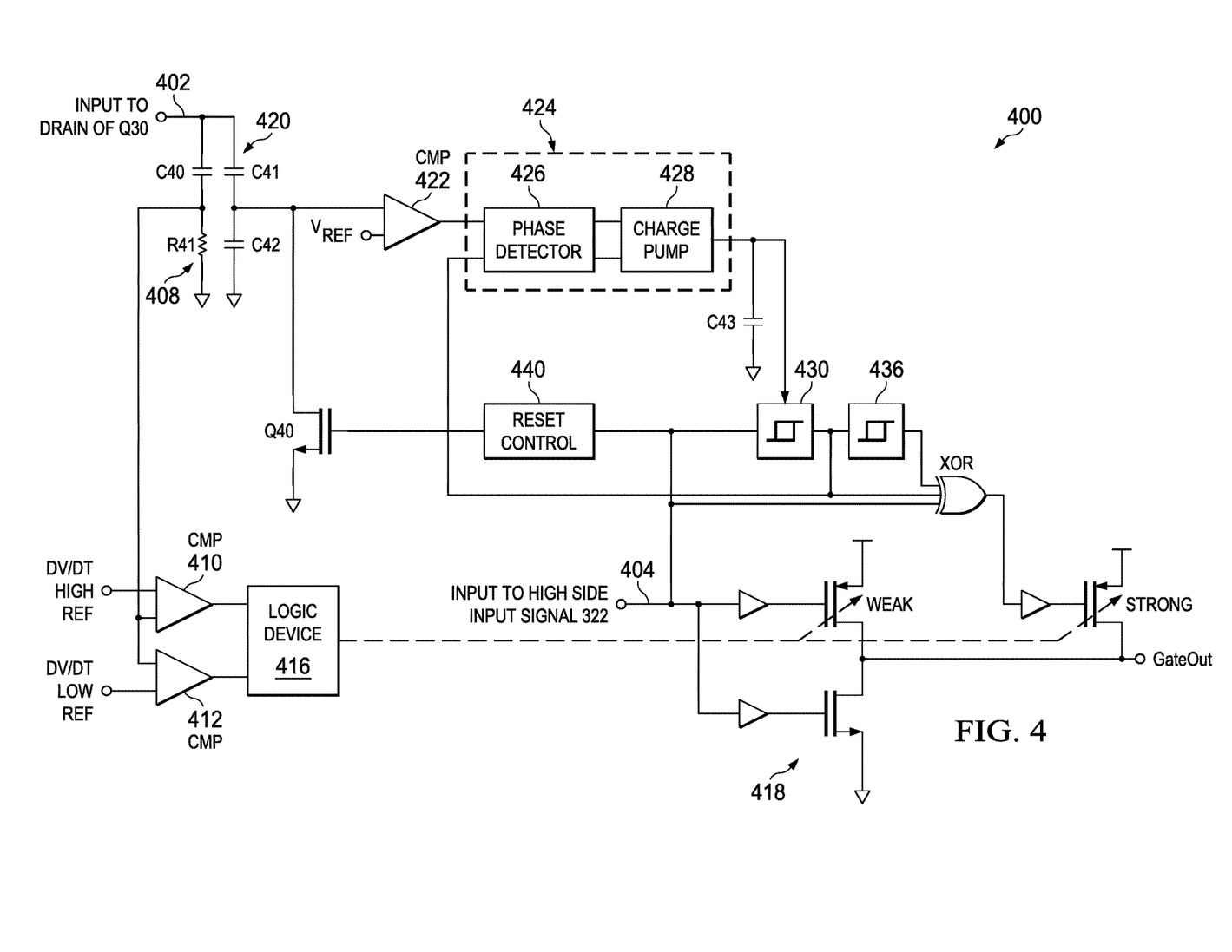
FIG. 4 is a block diagram of example circuitry within the processor and driver of the switched driver of FIG. 3A.

FIG. 4 is a block diagram of example circuitry 400 within the processor 320 and driver 310 of the switched driver 300 of FIG. 3A. The circuitry 400 generates the output voltage $V_{OUT}$ shown in the graph 334 or a similar waveform and adjusts the slew rate of the output voltage $V_{OUT}$ as described above. Accordingly, the circuitry 400 controls the slew rate and ringing of the output voltage $V_{OUT}$. The circuitry 400 includes an input 402 that is coupled to the drain of the high-side FET, which in FIG. 3A is transistor Q30, and may analyze the drain to source voltage across transistor Q30. In some examples, the input 402 is coupled to the input voltage $V_{IN}$. A second input 404 is coupled to the high-side signal input 322 for transistor Q30.

The capacitor C30 of FIG. 3A is replaced with two capacitors C40 and C41 in the circuitry 400. Capacitor C40 is coupled in series with resistor R41 to form a high-pass filter 408. The output of the high-pass filter 408 is coupled to first inputs of a comparator 410 and a comparator 412.

The second input of the comparator 410 is coupled to a voltage that is referred to as the dv/dt high reference voltage and the second input of the comparator 412 is coupled to a voltage that is referred to as the dv/dt low reference voltage. The output of the high-pass filter 408 is proportional to the slew rate of the drain voltage of the high-side FET. The comparators 410 and 412 output voltages that are indicative of whether the slew rate is greater than a value correlated to the dv/dt high reference voltage or lower than a value correlated to the dv/dt low reference voltage.

A logic device 416 receives the signals generated by the comparators 410 and 412 and drives output switches 418. The output switches 418 are a plurality of switches that are selectable to turn off and on in parallel. The number of output switches 418 that are turned on is proportional to the drive into the high-side transistor Q30 of FIG. 3A and thus the resistance of the high-side transistor Q30. In some examples, the output switches 418 include eight FETs that are selectively turned on by the logic device 416 and other components described below. FIG. 4 references a weak FET and a strong FET, wherein the weak FET indicates a single or a few FETs that are turned on, which results in a relatively high resistance on the high-side transistor Q30. When the strong FET is activated, more FETs are turned on or the strong FET drives significant current, which reduces the resistance of the high-side transistor Q30. When the strong FET is turned on, the slope of the output voltage $V_{OUT}$ is steep and when the weak FET is turned on, the slope of the output voltage $V_{OUT}$ is not as steep.

The capacitor C41 is coupled in series with a capacitor C42 to form a capacitive voltage divider 420. The voltage at the input 402 may be too high to be processed by the components within the circuitry 400, so the voltage divider 420 attenuates the voltage to a voltage that is workable within the circuitry 400. The output of the voltage divider 420 is coupled to an input of a comparator 422 that compares the output of the voltage divider to a reference voltage $V_{REF}$. The reference voltage $V_{REF}$ correlates to a voltage that is a small fraction of the input voltage or proportional to the drain voltage by a factor related to the voltage division of the voltage divider 420. A switch is coupled in parallel with capacitor C42 and serves to discharge the capacitor. In the example of FIG. 4, the switch is a FET Q40.

The output of the comparator 422 is coupled to a delay-locked loop (DLL) 424, which includes a phase detector 426 and a charge pump 428. The DLL 424 generates a signal correlated to the alignment of the present drain voltage at the input 402 to the actual timing of the output voltage $V_{OUT}$. For example, the DLL 424 compares the present drain voltage to the time when the circuitry 400 increased the resistance of Q30 in FIG. 3A, which is the time t3 in FIG. 3B. The charge pump 428 charges a capacitor C43 proportional to the initial time that $V_{OUT}$ rises, which is between time t2 and time t3 on the graph 334 of FIG. 3B. If a longer period between the times t2 and t3 is required, the charge on capacitor C43 is increased and if a shorter period between the times t2 and t3 is required, the charge on capacitor C43 is decreased.

The charge pump 428 determines the time of a delay 430, which determines the period between time t2 and time t3 on the graph 334. The output of the delay 430 is an input to an exclusive OR (XOR) gate, a delay 436, and an input to the phase detector 426. In the example of FIG. 4, the delay 436 is a fixed delay and serves to set the period between t3 and t4 in the graph 334. The output of the delay 436 is coupled to an input of the XOR gate as is the input 404. The input 404 is also coupled to the weak portion of the drive switches 418. The voltage present at the input 404 during operation of the circuitry 400 stays at a logic 1 during periods when a controller, not shown, determines that the high-side transistor Q30 is to be turned on.

The XOR gate outputs a logic 1 when an odd number of inputs are logic 1 and it outputs a logic 0 when an even number of inputs are logic 1. When a cycle initially starts, the outputs of the delays 430 and 436 are logic 0 and the voltage at the input 404 is logic 1, so the XOR gate outputs a logic 1, which causes a strong output from the switches 418. The logic 1 at the input 404 also causes a signal change into a reset control 440, which closes transistor Q40 to reset the input to the comparator 422. The reset controller 440 serves as a delay to prevent transistor Q40 from closing until the output voltage $V_{OUT}$ has settled, which is after the time t4. A logic 1 output by the XOR gate causes a strong drive from the output switches 418, which drives transistor Q30 of FIG. 3A strong, resulting in the steep transition of the output voltage $V_{OUT}$ between time t2 and time t3 as shown by the graph 334. When the output of the delay 430 changes state, such as to logic 1, at time t3, there are an even number of inputs to the XOR gate, so it outputs a logic 0, which turns off the strong output of the output switches 418. The output voltage $V_{OUT}$ drops in response to the strong output from the output switches 418 being reduced, which is shown by the voltage drop between time t3 and time t4. At time t4, the output of delay 436 transitions, such as to logic 1, and there are an odd number of inputs to the XOR gate once again so it outputs a logic 1 at time t4 which turns on the strong output as shown by graph 330.

The circuitry 400 provides for convergence of the output voltage $V_{OUT}$. For example, the DLL 424 sets the period of the first delay 430 in response to the output voltage $V_{OUT}$ of the previous cycle of the gate voltage. Accordingly, the DLL 424 may increase or decrease the period of the delay 430 to reach a predetermined output voltage $V_{OUT}$. This convergence may take a plurality of cycles of the gate resistance increasing and decreasing.

As described above, the logic device 416 determines the number of output switches 408 that are turned on for a strong output. Therefore, when the strong output is activated, the drive into the high-side transistor Q30 is set by the logic device 416 so that the slew rate is within predetermined parameters correlated with the dv/dt high reference voltage and the dv/dt low reference voltage. Accordingly, the circuitry 400 controls the slew rate and attenuates ringing in the output voltage $V_{OUT}$.

The circuitry 400 has been described above as driving the high-side transistor Q30. In other examples, the circuitry drives the low-side transistor Q31. Slight modifications as known by those skilled in the art may be applied to the circuitry 400 to function in relation with the low-side transistor Q31. The circuits and methods have been described herein as performing one cycle of decreasing resistance, increasing resistance, and then decreasing resistance of the high-side transistor Q30. In other examples, a cycle may include several periods of increasing and decreasing the resistance of the high-side transistor Q30 and/or the low side transistor Q31, resulting in more peaks and valleys in the graph 330.

Figure 5:
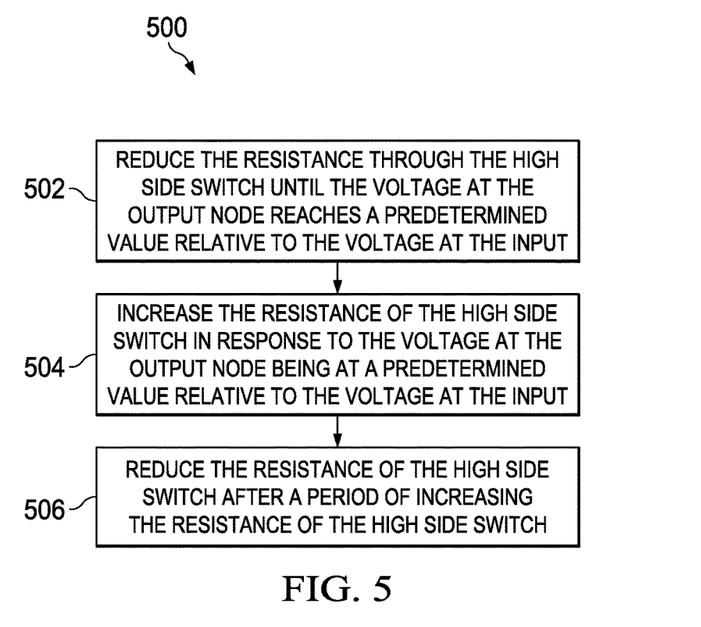
FIG. 5 is a flow chart describing the operation of a switched driver that generates an output voltage similar to the output voltage described in FIG. 3B.

FIG. 5 is a flow chart 500 describing the operation of a switched driver that generates an output voltage similar to the output voltage $V_{OUT}$ described in graph 334 of FIG. 3B. The switched driver represented by the flow chart 500 includes an input, a high-side switch, and a low-side switch. An output node is coupled between the high-side switch and the low-side switch. The method commences with reducing the resistance through the high-side switch until the voltage at the output node reaches a predetermined value relative to the voltage at the input at step 502. At step 504, the resistance of the high-side switch is increased in response to the voltage at the output node being at a predetermined value relative to the voltage at the input. At step 506, the resistance of the high-side switch is reduced.

While some examples of buffers have been described in detail herein, it is to be understood that the inventive concepts may be otherwise variously embodied and employed and that the appended claims are intended to be construed to include such variations except insofar as limited by the prior art.

What is claimed is:

1. A switched driver comprising:
   a high-side switch;
   a low-side switch coupled to the high-side switch;
   an output coupled between the high-side switch and the low-side switch; and
   a switch controller coupled to either the high-side switch or the low-side switch having a switch controller input for receiving a switch control signal and an switch controller output for controlling the coupled switch, the switch controller providing a cycle of initially reducing the resistance of the coupled switch, then increasing the resistance of the coupled switch, and then reducing the resistance of the coupled switch in response to a signal received at the switch input;
   wherein the switch controller further comprises a voltage input coupled to the switch that is coupled to the voltage input, wherein the voltage input receives a voltage that is proportional to the voltage across the switch.

2. The switched driver of claim 1, further comprising a first comparator having a first input coupled to the voltage input and a second input coupled to a reference voltage, the first comparator generating a first comparator output signal in response to the voltage at the first input being substantially close to the voltage at the second input, wherein the switched controller decreases the resistance of the switch in response to the first comparator output signal.

3. A switched driver comprising:
   a high-side switch;
   a low-side switch coupled to the high-side switch;
   an output coupled between the high-side switch and the low-side switch; and
   a switch controller coupled to either the high-side switch or the low-side switch having a switch controller input for receiving a switch control signal and an switch controller output for controlling the coupled switch, the switch controller providing a cycle of initially reducing the resistance of the coupled switch, then increasing the resistance of the coupled switch, and then reducing the resistance of the coupled switch in response to a signal received at the switch input;
   wherein the switch controller comprises a first delay device, wherein the first delay device is for generating a first delay signal for a period, and wherein the switch controller increases the resistance of the coupled switch in response to the first delay signal.

4. The switched driver of claim 3, further comprising:
   a voltage input coupled to the switch that is coupled to the voltage input, wherein the voltage input receives a voltage that is proportional to the voltage across the switch; and
   a first comparator having a first input coupled to the voltage input and a second input coupled to a reference voltage, the first comparator generating a first comparator output signal in response to the voltage at the first input being substantially close to the voltage at the second input, wherein the first delay device is initialized in response to the first comparator output signal.

5. The switched driver of claim 3, wherein the switch controller comprises a second delay device, wherein the second delay device is for generating a second delay signal for a period, and wherein the switch controller decreases the resistance of the coupled switch in response to the second delay signal.

6. The switched driver of claim 5, wherein the period of at least one of the first delay device and the second delay device is set in response to an output of the switched controller generated by a previous cycle of the switch controller.

7. A switched driver comprising:
   a high-side switch;
   a low-side switch coupled to the high-side switch;
   an output coupled between the high-side switch and the low-side switch; and
   a switch controller coupled to either the high-side switch or the low-side switch having a switch controller input for receiving a switch control signal and an switch controller output for controlling the coupled switch, the switch controller providing a cycle of initially reducing the resistance of the coupled switch, then increasing the resistance of the coupled switch, and then reducing the resistance of the coupled switch in response to a signal received at the switch input;
   wherein the switch controller further comprises:
   circuitry for determining the slew rate of the voltage at the output;
   circuitry for adjusting the resistance of the coupled switch in response to the slew rate of the voltage at the output.

8. The switched driver of claim 7, wherein the circuitry for determining the slew rate of the voltage at the output includes a high-pass filter having a high-pass filter output and a high-pass filter input coupled to the coupled switch; and wherein the circuitry for adjusting the resistance of the coupled switch includes at least one comparator coupled to the high-pass filter output, wherein the at least one comparator is for comparing the output of the high-pass filter to a predetermined voltage, and wherein the output of the comparator determines the resistance of the coupled switch.

9. The switched driver of claim 7, wherein the circuitry for determining the slew rate of the voltage at the output includes a high-pass filter having a high-pass filter output and a high-pass filter input coupled to the coupled switch; and wherein the circuitry for adjusting the resistance of the coupled switch includes:
   a first comparator for comparing the output of the low-pass filter to a first voltage correlated to a minimum slew rate; and
   a second comparator for comparing the output of the low-pass filter to a second voltage correlated to a maximum slew rate.

10. The switched driver of claim 9, wherein the circuitry for adjusting the resistance is for reducing the resistance of the coupled switch in response to the output of the high-pass filter being less than the first voltage; and for increasing the resistance of the coupled switch in response to the output of the high-pass filter being greater than the second voltage.

11. The switched driver of claim 7, wherein the circuitry for adjusting the resistance of the coupled switch includes a plurality of selectable switches for driving the coupled switch, wherein the number of selectable switches that are selected correlates to the resistance of the coupled switch.

12. A method of operating a switched driver having an input, a high-side switch, and a low-side switch coupled to an output node, the method comprising:
   reducing the resistance through the high-side switch until the voltage at the output node reaches a predetermined value relative to the voltage at the input;
   increasing the resistance of the high-side switch in response to the voltage at the output node reaching a predetermined value relative to the voltage at the input; and
   reducing the resistance of the high-side switch after a period of increasing the resistance of the high-side switch.

13. The method of claim 12, wherein increasing the resistance of the high-side switch includes increasing the resistance of the high-side switch for a period, wherein the period is in response to the voltage on the output node from a previous cycle of reducing the resistance, increasing the resistance, and reducing the resistance.

14. The method of claim 12, further comprising increasing the resistance of the low-side switch prior to reducing the resistance through the high-side switch until the voltage at the output node reaches a predetermined value relative to the voltage at the input.

15. The method of claim 14, wherein increasing the resistance of the low-side switch includes opening the low-side switch.

16. The method of claim 12 wherein the high-side switch is a transistor and wherein reducing the resistance of the high-side switch includes reducing the resistance between the drain and source of the transistor.

17. The method of claim 12 wherein the high-side switch is a transistor and wherein increasing the resistance of the switch includes increasing the resistance between the drain and source of the transistor.

18. A switched driver comprising:
   a high-side switch;
   a low-side switch coupled to the high-side switch;
   an output coupled between the high-side switch and the low-side switch; and
   a switch controller coupled to either the high-side switch or the low-side switch having a switch controller input for receiving a switch control signal and an output for controlling the coupled switch, the switch controller having circuitry for monitoring the slew rate of the voltage of the output and for changing the resistance of the coupled switch to maintain the slew rate within a predetermined range.

19. The switched driver of claim 18, wherein the circuitry includes a high-pass filter, wherein the output of the high-pass filter is indicative of the slew rate.

20. A method of operating a switched driver having an input for receiving an input voltage, a high-side switch, a low-side switch, and an output node coupled between the high-side switch and the low-side switch, the method comprising:
   reducing the resistance through one of either the low-side switch and the high-side switch;
   measuring the slew rate of the voltage across one of the high-side switch or the low-side switch having the reduced resistance; and
   adjusting the resistance of one of the high-side switch or the low-side switch having the reduced resistance to achieve a slew rate within a predetermined range.

21. The method of claim 20, wherein the high-side switch and the low-side switch are transistors and wherein adjusting the resistance includes changing the drive into the gate of one of the high-side switch or the low-side switch having the reduced resistance.

\* \* \* \* \*